United States Patent
Arisaka

(10) Patent No.: US 7,696,803 B2
(45) Date of Patent: Apr. 13, 2010

(54) SIGNAL GENERATING CIRCUIT

(75) Inventor: Osamu Arisaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/292,618

(22) Filed: Nov. 21, 2008

(65) Prior Publication Data

US 2009/0146710 A1    Jun. 11, 2009

(30) Foreign Application Priority Data

Dec. 5, 2007    (JP) .............................. 2007-314896

(51) Int. Cl.
*H03H 11/26*    (2006.01)
(52) U.S. Cl. ...................... 327/276; 327/291
(58) Field of Classification Search ............... None
See application file for complete search history.

(56) References Cited

U.S. PATENT DOCUMENTS

| | | | |
|---|---|---|---|
| 6,658,583 B1 | 12/2003 | Kudo et al. | |
| 7,017,069 B2 | 3/2006 | Kudo et al. | |
| 7,378,893 B1* | 5/2008 | Kang | 327/291 |
| 7,453,301 B1* | 11/2008 | Kaviani | 327/231 |
| 2003/0011416 A1* | 1/2003 | Miura | 327/276 |
| 2007/0210846 A1* | 9/2007 | Wang | 327/276 |

FOREIGN PATENT DOCUMENTS

| JP | 05-167404 | 7/1993 |
|---|---|---|
| JP | 2000-269816 A | 9/2000 |

* cited by examiner

*Primary Examiner*—Cassandra Cox
(74) *Attorney, Agent, or Firm*—Foley & Lardner LLP

(57) ABSTRACT

A signal generating circuit includes an input stage delay circuit which can switch a state of outputting a reference clock and a state of outputting a signal delaying the reference clock by a first time which is shorter than one cycle of the reference clock, a control section including a gate circuit holding the output of the input stage delay circuit for a second time which is shorter than one cycle of the reference clock from a point at which the output of the input stage delay circuit is changed to output a signal corresponding to the output of the gate circuit, and an output stage delay circuit outputting a signal delaying the output signal of the control section by the second time, in which the input stage delay circuit switches an output state in response to change of the output signal of the control section.

20 Claims, 9 Drawing Sheets

SIGNAL GENERATING CIRCUIT

BACKGROUND

1. Field of the Invention

The present invention relates to a signal generating circuit controlling an L level period and an H level period of an output signal.

2. Description of Related Art

In recent years, as electronic devices perform high-speed operation, it has become more and more important to control the timing at which the pulse transits more finely. Japanese Unexamined Patent Application Publication No. 2000-269816 (Kudo et al.) discloses a PWM control circuit delaying a rising edge using a delay circuit. The PWM control circuit delays the rising edge to output a signal whose duty ratio is changed. However, in the PWM control circuit disclosed in Kudo et al., the cycle of the signal which is output is not at all considered. On the other hand, Japanese Unexamined Patent Application Publication No. 5-167404 (Shinpo) discloses an oscillation control device outputting a signal whose cycle is extended. The oscillation control device disclosed by Shinpo delays a reference clock generated by an oscillator using a plurality of delay circuits, selects any output from outputs of a plurality of delay circuits based on a counter value, and extends the pulse width of the clock.

SUMMARY

In the oscillation control device disclosed by Shinpo, only the signal whose pulse width is extended or the signal whose pulse width is not extended is output. The present inventors have found a problem that it is difficult to output a plurality of kinds of signals considering the extension of the cycle.

A first exemplary aspect of an embodiment of the present invention is a signal generating circuit including an input stage delay circuit which can switch a state of outputting a reference clock and a state of outputting a signal delaying the reference clock by a first time which is shorter than one cycle of the reference clock, a control section including a gate circuit holding the output of the input stage delay circuit for a second time which is shorter than one cycle of the reference clock from a point at which the output of the input stage delay circuit is changed to output a signal corresponding to the output of the gate circuit, and an output stage delay circuit outputting a signal delaying the output signal of the control section by the second time, in which the input stage delay circuit switches an output state in response to change of the output signal of the control section.

The control section holds the output of the input stage delay circuit for the second time which is shorter than one cycle of the reference clock from a point at which the output of the input stage delay circuit is changed to switch the output state of the input stage delay circuit in response to the change of the output signal of the control section, whereby it is possible to output the signal with delay of the second time from the output stage delay circuit.

According to the present invention, it is possible to provide a signal generating circuit outputting a plurality of output signals controlled by a cycle finer than that of the reference clock.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
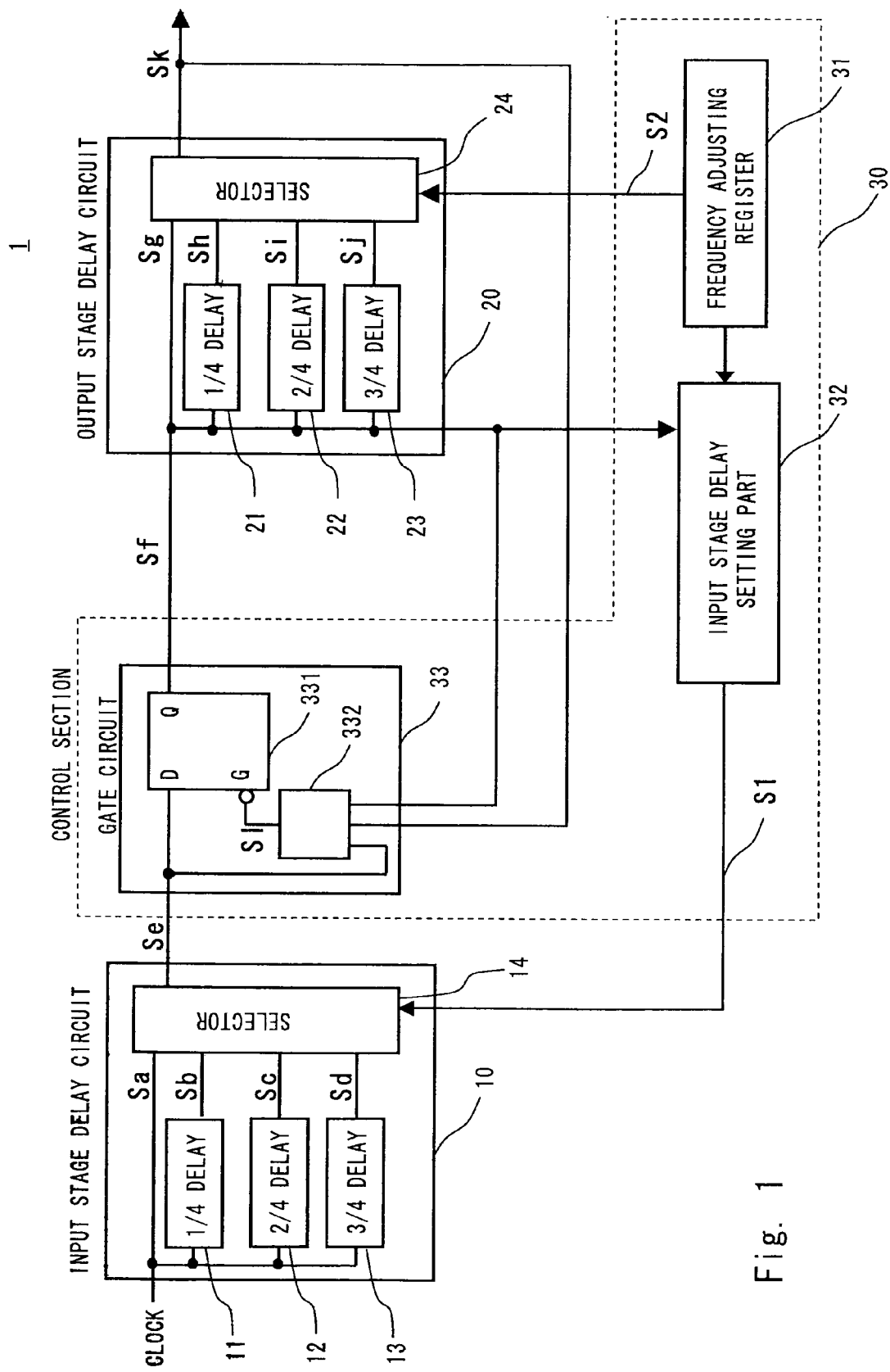
FIG. 1 is a block diagram showing a signal generating circuit according to a first exemplary embodiment.

Hereinafter, the exemplary embodiments of the present invention will be described in detail with reference to the drawings. FIG. 1 is a block diagram showing a signal generating circuit according to the first exemplary embodiment. As shown in FIG. 1, a signal generating circuit 1 of the first exemplary embodiment includes an input stage delay circuit 10, an output stage delay circuit 20, and a control section 30.

The input stage delay circuit 10 includes a plurality of delay elements 11 to 13, and a selector 14. The plurality of delay elements 11 to 13 each output the input reference clock with a delay of time (first time) which is set based on the reference clock. In the first exemplary embodiment, the delay element 11 outputs the reference clock with the delay of ¼ cycle. Hereinafter, the delay element 12 outputs the reference clock with the delay of 2/4 cycle, and the delay element 13 outputs the reference clock with the delay of ¾ cycle.

The selector 14 of the input stage delay circuit 10 selects and outputs any one of the reference clock and the signals output from the delay elements 11 to 13 based on an input stage delay selection signal S1 described later. The signal output from the selector 14 is output as an input stage delay output signal Se to a gate circuit 33 described later. The selector 14 selects a state of outputting the reference clock at first. Then any one of the delay elements is selected based on the input stage delay selection signal S1 described later when the selection of the selector 14 is switched for the first time. In this case, the delay element which can provide a delay time equal to the value output to the selector 24 described below of the output stage delay circuit 20 (delay element to be selected) is selected.

The control section 30 includes a frequency adjusting register 31, an input stage delay setting part 32, and a gate circuit 33. The frequency adjusting register 31 is a register holding the setting corresponding to the frequency of the output signal. The value held in the frequency adjusting register 31 is output to the input stage delay setting part 32 and to the selector 24 of the output stage delay circuit 20 described later.

The input stage delay setting part 32 outputs the input stage delay selection signal (hereinafter referred to as first selection signal) S1 selecting any one of the reference clock and the signals delaying the reference clock by the delay elements 11 to 13 to the selector 14 in the input stage delay circuit 10. The input stage delay setting part 32 sequentially switches the delay element to be selected every time the output of the gate circuit 33 described later transits. The input stage delay setting part 32 sequentially switches the delay element to be selected based on a state in which the output of the gate circuit 33 is raised or fallen. The first selection signal S1 is the signal indicating that the delay element is selected which can provide a delay time equal to the value output to the selector 24 described below of the output stage delay circuit 20 (delay element to be selected).

The gate circuit 33 is a circuit controlling the input of the signal (input stage delay output signal Se) output from the input stage delay circuit 10 to the output stage delay circuit 20. The gate circuit 33 according to the first exemplary embodiment includes a latch circuit 331 and a match detecting part 332. The latch circuit 331 determines based on the output of the match detecting part 332 whether the output value is fixed regardless of the input to the latch circuit 331 or the input value to the latch circuit 331 is directly output. The match detecting part 332 detects match and mismatch of the output of the gate circuit 33, the output of the input stage delay circuit 10, and the output of the output stage delay circuit 20. When the three inputs do not match, the match detecting part 332 outputs the signal fixing the output value regardless of the value input to the latch circuit 331. When the three inputs match, the value input to the latch circuit 331 is directly output from the latch circuit 331.

The output stage delay circuit 20 is a circuit directly outputting the signal output from the gate circuit 33 or outputting the signal output from the gate circuit 33 after delaying the signal by a predetermined amount based on the value set in the frequency adjusting register 31. The output stage delay circuit 20 includes a plurality of delay elements 21 to 23 and a selector 24. The plurality of delay elements 21 to 23 delay the output of the gate circuit 33 by second time to output the delayed signal. In the first exemplary embodiment, the plurality of delay elements 21 to 23 delay the output of the gate circuit 33 by ¼ cycle, 2/4 cycle, and ¾ cycle of the reference clock, for example, to output the delayed signals.

In the first exemplary embodiment, the output stage delay circuit 20 outputs a signal with a delay of time corresponding to m/n (m and n are natural numbers, m<n, and irreducible fraction) time with respect to one cycle of the reference clock. In this case, each of the input stage delay circuit 10 and the output stage delay circuit 20 includes (n−1) delay elements which can provide the delay of 1/n, 2/n, . . . , (n−2)/n, and (n−1)/n times. In the first exemplary embodiment, n is 4, and each of the input stage delay circuit 10 and the output stage delay circuit 20 includes three delay elements. However, the present invention can be applied when n≧2.

The selector 24 in the output stage delay circuit 20 selects any one of the signals output from the gate circuit 33 and the delay elements 21 to 23 to output the selected signal based on the value set in the frequency adjusting register 31. More specifically, the frequency adjusting register 31 outputs to the selector 24 in the output stage delay circuit 20 an output stage delay selection signal (hereinafter referred to as second selection signal) S2 held in the frequency adjusting register 31 and selecting any one of the signals output from the gate circuit 33 and the delay elements 21 to 23. As such, the selector 24 selects from (n−1) delay elements a delay element which can provide the delay of m/n time.

Figure 2:
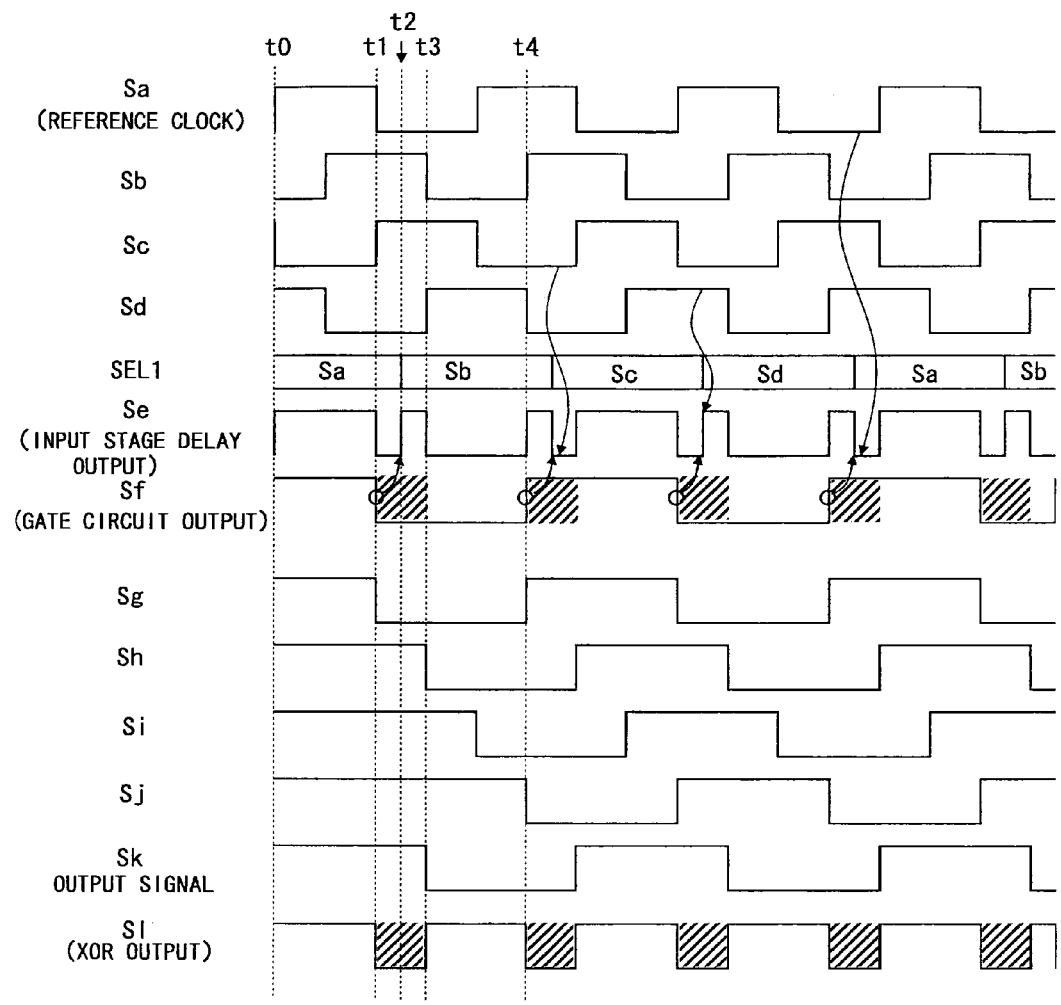
FIG. 2 is a timing chart showing an operation of the signal generating circuit when a delay element extending a period by ¼ cycle is selected.

Now, the operation of the signal generating circuit 1 structured as above will be described with reference to FIG. 2. FIG. 2 shows a timing chart showing the operation of the signal generating circuit 1 shown in FIG. 1. More specifically, FIG. 2 is a timing chart showing waveforms in each point in the signal generating circuit 1. FIG. 2 also shows which delay element is output from the selector 14 in the input stage delay circuit 10 in each timing based on the first selection signal S1. In FIG. 2, Sa to Sl show waveforms corresponding to Sa to Sl of FIG. 1, respectively. In the following description, it is assumed that the output stage delay circuit 20 outputs the signal with the delay of ¼ time (in this case, m=1, n=4) with respect to one cycle of the reference clock. In other words, the description will be made referring to an example of outputting a clock in which a clock is extended by ¼ cycle for both the H period and the L period, which is a clock of a cycle 1.25 times larger than the cycle of the reference clock.

In the frequency adjusting register 31, the value indicating the value corresponding to the signal output from the frequency adjusting register 31 (here, cycle 1.25 times as large as the reference clock) is set. In the output stage delay circuit 20 receiving the value set in the frequency adjusting register 31 as the output stage delay selection signal S2, the signal output from the selector 24 is fixed to the output Sh of the ¼ delay element.

Note that, in the following description, the gate circuit output Sf and the output signal Sk are set to the H level as a default at the start of clock input (see t0 in FIG. 2). When the reference clock is input, the selector 14 selects the reference clock Sa to be input based on the value set in the frequency adjusting register 31. Accordingly, the input stage delay circuit 10 outputs the H level signal as the input stage delay output signal Se at time t0. The gate circuit output Sf keeps the H level.

Then, at time t1, the reference clock which is input is fallen. Since the selector 14 selects the reference clock Sa, the signals Se and Sf are fallen in accordance with the falling of the Sa. At this time, since the signal (see Sh in FIG. 2) delaying the output signal Sf of the gate circuit 33 by the ¼ cycle is selected as the output signal Sk, the output signal Sk keeps the H level. At this time, there is caused a mismatch among the input stage delay output signal Se, the output Sf of the gate circuit 33, and the output signal Sk. Accordingly, the output of the match detecting part 332 transits, and the latch circuit 331 keeps the output signal at this time regardless of the input signal (see Sf and Sl in FIG. 2).

As the output Sf of the gate circuit 33 is fallen to transit, the input stage delay setting part 32 outputs to the selector 14 the first selection signal S1 switching the signals to be selected. The delay element 21 outputting the signal with the delay of ¼ time is selected in the selector 24 of the output stage delay circuit 20. Hence, the input stage delay setting part 32 outputs to the selector 14 the first selection signal S1 switching the signal to be selected to Sb. The selector 14 selects the output Sb from the ¼ delay element based on the first selection signal S1 from the input stage delay setting part 32 at time t2. Hence, the input stage delay output signal Se is also raised to be the H level (see t2 in FIG. 2). At this time, since the latch circuit 331 has an output fixed by the output of the match detecting part 332, the output Sf of the gate circuit 33 does not change but keeps the L level.

After that, at time t3, the input stage delay output signal Se is also fallen in accordance with the falling of the output signal Sb of the ¼ delay element 11. As the input stage delay output signal Se is fallen, the levels of the input stage delay output signal Se, the output Sf of the gate circuit 33, and the output signal Sk match with each other. Hence, the latch circuit 331 cancels the holding of the output of the input stage delay circuit 10 and outputs the input signal again.

For example, the delay element of the output stage delay circuit 20 is fixed to the ¼ cycle delay in the signal generating circuit 1 shown in the first exemplary embodiment. When the signal Sf output from the gate circuit 33 transits, the delay elements selected by the input stage delay circuit 10 are sequentially switched. During a period after the signal Sf transits and before the levels of the input stage delay output signal Se, the output Sf of the gate circuit 33, and the output signal Sk match, the signal Sf keeps the level of the output Se of the input stage delay circuit 10. Hence, it is possible to output from the signal generating circuit 1 the output signal Sk whose cycle is extended by a unit shorter than that of the reference clock.

Figure 3:
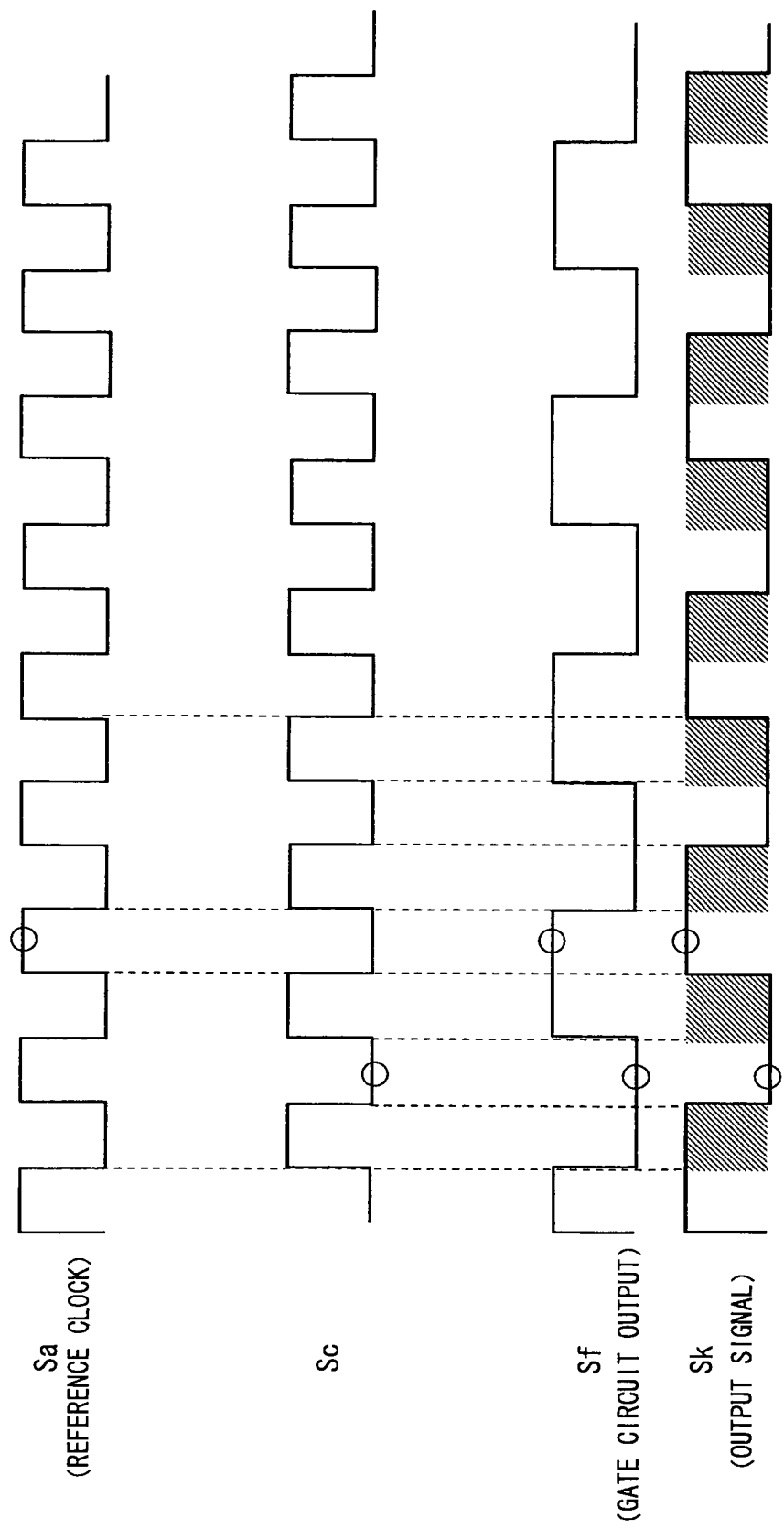
FIG. 3 is a timing chart showing an operation of the signal generating circuit when the delay element extending the period by 2/4 cycle is selected.

Now, FIG. 3 shows a timing chart showing an operation when the delay element of the output stage delay circuit 20 is fixed to the ⅔ cycle delay. FIG. 3 shows the reference clock Sa, the output Sc from the delay element 12 delaying the reference clock by ⅔ cycle, the output Sf of the gate circuit 33, and the output signal Sk from the output stage delay circuit 20 shown in FIG. 2. Referring to FIG. 3, the operation in a case in which the delay element of the output stage delay circuit 20 is fixed to the ⅔ cycle delay will be briefly described.

As shown in FIG. 3, a state of outputting the reference clock is first selected in the input stage delay circuit 10. When the selection of the selector 14 is switched according to the transition of the output of the gate circuit 33 of the control section 30 for the first time, the selector 14 of the input stage delay circuit 10 outputs the first selection signal S1 selecting the delay element which can provide a delay time equal to the value output to the selector 24 of the output stage delay circuit 20 (delay element to be selected). In other words, the delay element 12 delaying the reference clock by ⅔ cycle is selected in the selector 14. At this time, the output Sf of the gate circuit 33 keeps the level of the output Se of the input stage delay circuit 10 which is taken in switching the delay elements for the ⅔ cycle of the reference clock. Then, when the signal Sc which is output from the delay element 12 and from the input stage delay circuit 10, the output Sf of the gate circuit 33, and the output signal Sk of the output stage delay circuit 20 match with each other, the latch circuit 331 cancels the holding of the output of the input stage delay circuit 10. Accordingly, the signal obtained by delaying the reference clock by ⅔ cycle is output as the output signal Sk.

When the delay element of the output stage delay circuit 20 is fixed to the ⅔ cycle delay, the input stage delay circuit 10 alternately selects the reference clock Sa and the delay element 12 delaying the reference clock by ⅔ cycle. In accordance with this, the output signal Sk whose cycle is extended by a unit shorter than that of the reference clock can be output from the output stage delay circuit 20.

Figure 4:
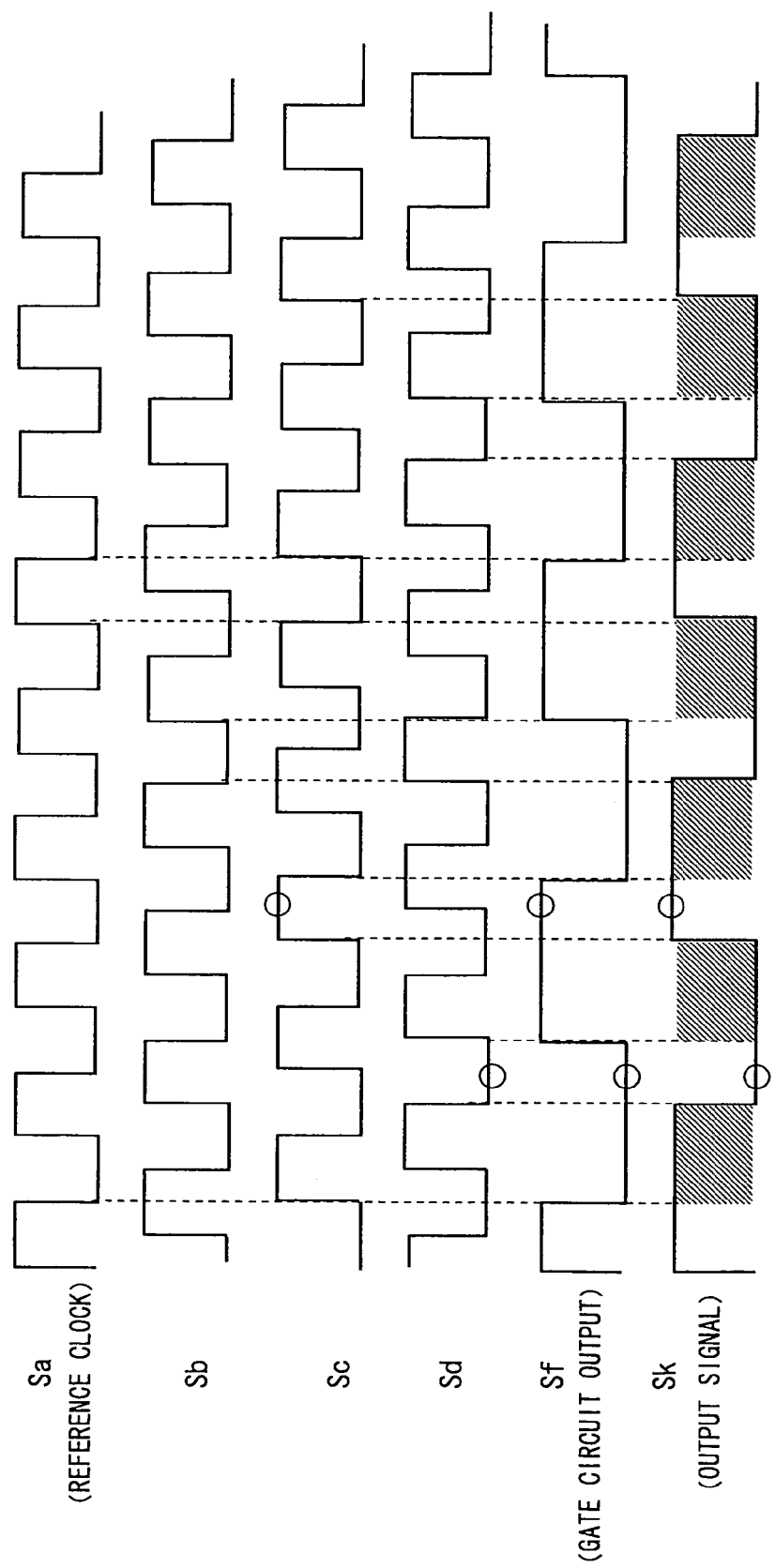
FIG. 4 is a timing chart showing an operation of the signal generating circuit when the delay element extending the period by ¾ cycle is selected.

Now, FIG. 4 shows a timing chart showing an operation in which the delay element of the output stage delay circuit 20 is fixed to the ¾ cycle delay. In FIG. 4, the reference clock Sa, the signals Sb to Sd output from each delay element, the output Sf of the gate circuit 33, and the output signal Sk of the output stage delay circuit 20 shown in FIG. 2 are shown. Referring to FIG. 4, the operation in a case in which the delay element of the output stage delay circuit 20 is fixed to the ¾ cycle delay will be briefly described.

As shown in FIG. 4, a state of outputting the reference clock is first selected in the input stage delay circuit 10. Then, the selector 14 of the input stage delay circuit 10 selects the delay element 13 delaying the reference clock by ¾ cycle according to the transition of the output of the gate circuit 33. At this time, the output Sf of the gate circuit 33 keeps the level of the output Se of the input stage delay circuit 10 which is taken in switching the delay elements for the ¾ cycle of the reference clock. When the signal Sd which is output from the delay element 13 and from the input stage delay circuit 10, the output Sf of the gate circuit, and the output signal Sk of the output stage delay circuit 20 match with each other, the latch circuit 331 cancels the holding of the output of the input stage delay circuit 10. Then, the selector 14 of the input stage delay circuit 10 sequentially selects the delay element 12 delaying the reference clock by ⅔ cycle and the delay element 11 delaying the reference clock by ¼ cycle. Accordingly, the signal delaying the reference clock by ¾ cycle is output as the output signal Sk.

From the above description, in the signal generating circuit 1 according to the first exemplary embodiment, each of the input stage delay circuit 10 and the output stage delay circuit 20 includes a plurality of delay elements having delay of cycle shorter than that of the reference clock. When the delay element of the output stage delay circuit 20 is fixed to the ¼ cycle delay and the signal Sf output from the gate circuit 33 transits, the delay elements selected by the input stage delay circuit 10 are sequentially switched. During a period after the signal Sf transits and before the input stage delay output signal Se transits to the level which is the same as that of the signal Sf, the signal Sf keeps the level of the output Se of the input stage delay circuit 10. Hence, it is possible to output from the signal generating circuit 1 the output signal Sk whose cycle is extended by a unit shorter than that of the reference clock. Further, the signal extending the output signal 1.75 times or twice longer can be output from the output stage delay circuit 20 by changing the delay element to be selected to the ⅔ delay element, or the ¾ delay element. In summary, it is possible to output the plurality of output signals controlled by cycle finer than that of the reference clock. Furthermore, it is possible to generate a plurality of output signals with finer delay than the cycle of the reference clock by having a simple configuration using the gate circuit 33 formed of the latch circuit 331 and the match detecting part 332 and the delay elements 11 to 13, 21 to 23.

Second Exemplary Embodiment

Next, the second exemplary embodiment will be described. In the second exemplary embodiment, a counter, a cycle compare register, and a duty compare register are added to the signal generating circuit 1 of the first exemplary embodiment. An inverting flip-flop (hereinafter referred to as inverting F/F) to which the signals output from the output stage delay circuit 20 and the duty compare register are input is also added. In the signal generating circuit 2 according to the second exemplary embodiment, the clock of the counter is extended for a certain period of time when the duty ratio of the output signal is controlled by a unit shorter than the cycle of the reference clock. Hereinafter, the signal generating circuit 2 according to the second exemplary embodiment will be described in detail.

Figure 5:
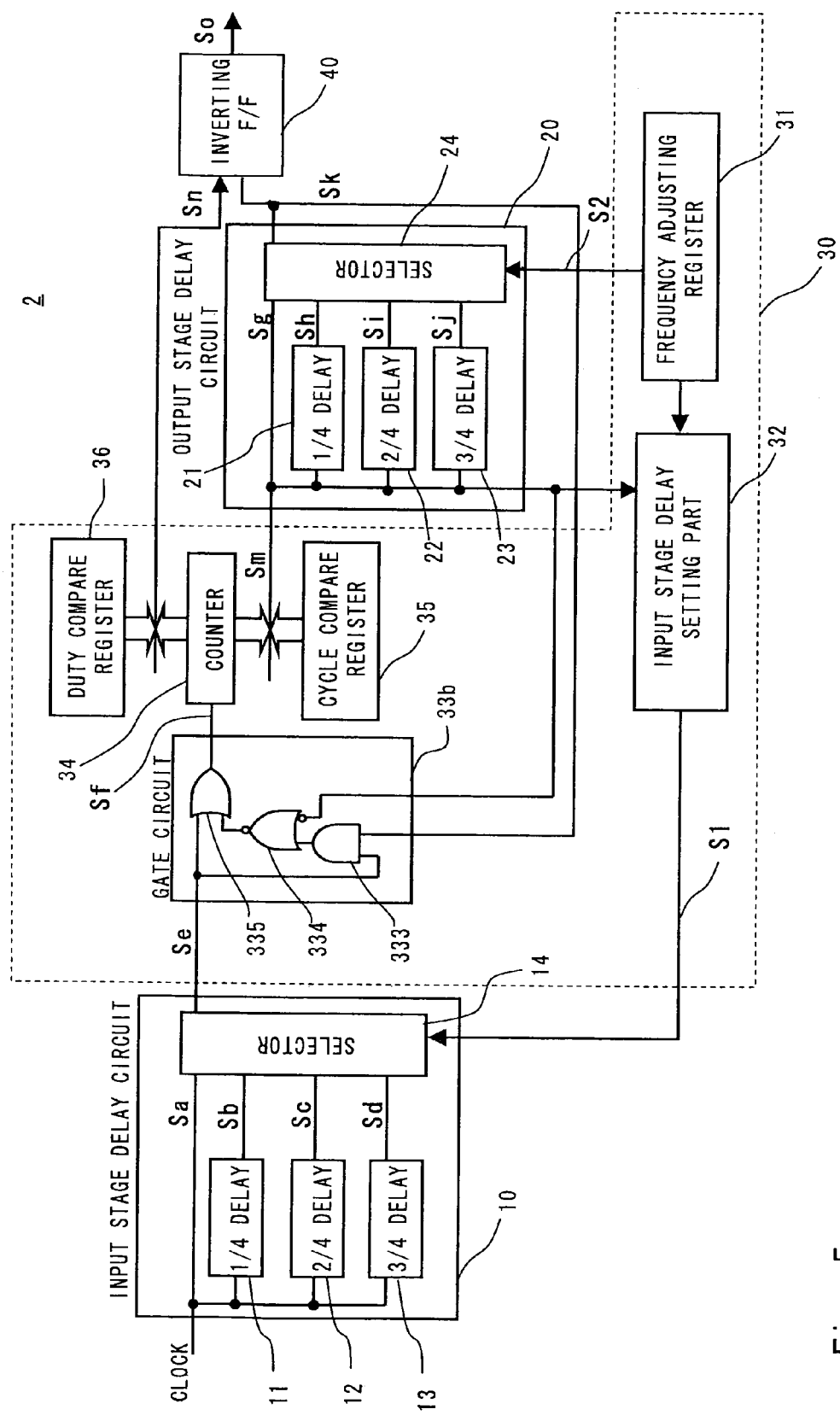
FIG. 5 is a block diagram showing a signal generating circuit according to a second exemplary embodiment.

One cycle of the output signal of the signal generating circuit 2 according to the second exemplary embodiment is equal to the number of clocks of the counter set in the cycle compare register. Further, when the number of clocks of the counter set in the duty compare register and the count of the counter match with each other, the output signal transits from the H level to the L level. Hereinafter, the signal generating circuit 2 of the second exemplary embodiment will be described in detail with reference to FIG. 5. FIG. 5 is a block diagram showing the signal generating circuit 2 according to the second exemplary embodiment. In the signal generating circuit 2 according to the second exemplary embodiment shown in FIG. 5, the same components as those in the first exemplary embodiment shown in FIG. 1 are denoted by the same reference symbols, and the detailed description thereof is omitted.

As shown in FIG. 5, the signal generating circuit 2 according to the second exemplary embodiment further includes a counter 34, a cycle compare register 35, and a duty compare register 36 in the control section 30, and includes an inverting F/F 40 in the output side of the output stage delay circuit 20.

The counter 34 counts the pulse of the signal Sf output from the gate circuit 33b.

The cycle compare register 35 sets the number of clocks (hereinafter referred to as cycle set value)(8 clocks, for example) with respect to one cycle of the target output clock. Further, a comparator which is not shown is included between the counter 34 and the cycle compare register 35. This comparator compares the number of clocks of the counter 34 with the cycle set value, and the comparator outputs the L level signal Sm when these number of clocks do not match. On the other hand, when the number of clocks of the counter 34 and the cycle set value match with each other, the comparator outputs the H level signal Sm. The signal corresponding to the comparison result of the comparator which is not shown and the cycle compare register 35 is output from the control section 30 as a signal corresponding to the output of the gate circuit 33b.

The duty compare register 36 sets the number of clocks (hereinafter referred to as duty set value)(3 clocks, for example) at a timing at which the output signal So output from the signal generating circuit 2 transits from the H period to the L period, for example. Further, a comparator which is not shown is included between the counter 34 and the duty compare register 36. This comparator compares the number of clocks of the counter 34 with the duty set value, and the comparator outputs the L level signal Sn when these number of clocks do not match. On the other hand, when the number of clocks of the counter 34 and the duty set value match with each other, the comparator outputs the H level signal Sn.

The inverting F/F 40 transits the output signal So when the signal Sn output from the comparator (not shown) formed between the counter 34 and the duty compare register 36 transits. Further, the inverting F/F 40 transits the output signal So when the signal Sk output from the output stage delay circuit 20 transits. In summary, the inverting F/F 40 changes the logic level of the output signal So in response to the output Sk of the output stage delay circuit 20 and the signal Sn.

Further, the gate circuit 33b includes an AND gate 333, an NOR gate 334, and an OR gate 335, for example. The gate circuit 33b extends the output signal Sf of the gate circuit 33b for a certain period of time so as to prevent the counter 34 from counting up when the selector 14 in the input stage delay circuit 10 switches the signals output based on the first selection signal S1.

Figure 6:
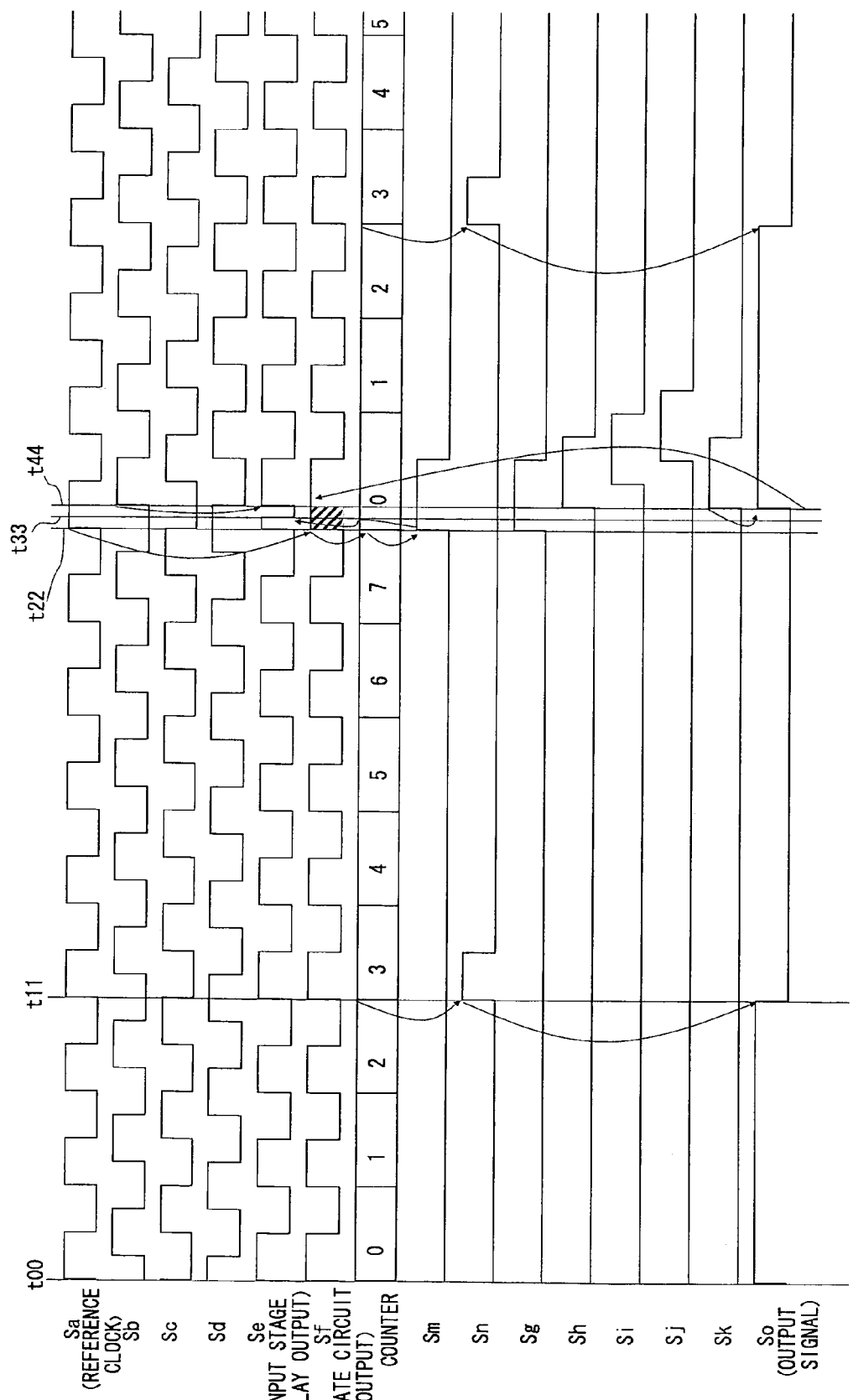
FIG. 6 is a flow chart showing an operation of the signal generating circuit shown in FIG. 5.
Figure 7:
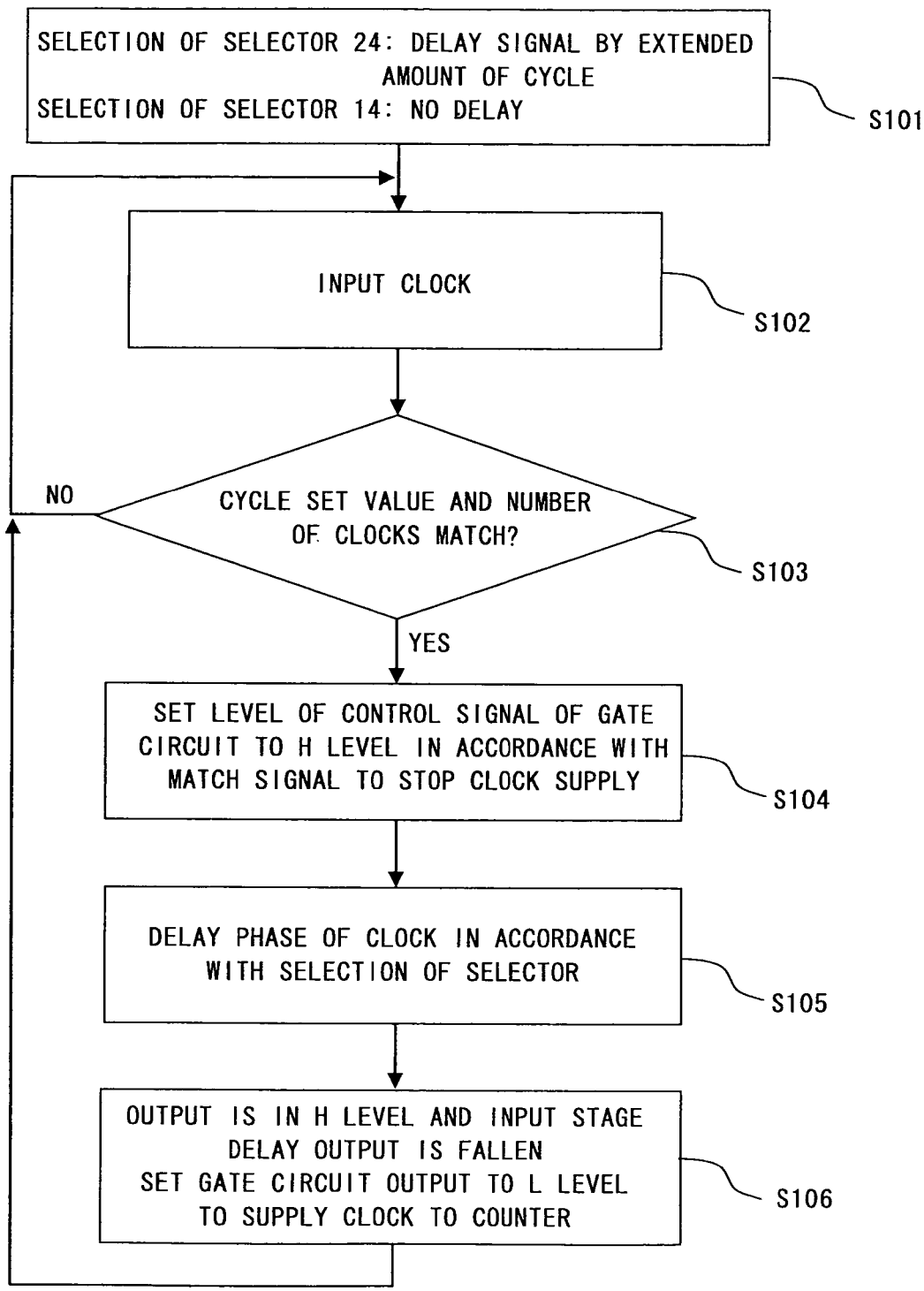
FIG. 7 is a timing chart showing an operation when a duty ratio of an output clock is controlled by ¼ cycle unit.

Next, the operation of the signal generating circuit 2 thus configured will be described hereinafter with reference to FIGS. 6 and 7. FIG. 6 is a timing chart showing waveforms in each point in the signal generating circuit 2. In FIG. 6, Sa to Sk and Sm to So show the waveforms corresponding to Sa to Sk and Sm to So in FIG. 5. FIG. 7 is a flow chart showing the operation of the signal generating circuit 2 shown in FIG. 6. In the following description, the description will be made on a case in which the duty ratio of the target output clock is controlled by ¼ cycle unit.

In the following description, the gate circuit output Sf is assumed to be set to the H level as a default at the start of clock input (see t00 in FIG. 6).

First, the value showing the value corresponding to the signal which is output from the frequency adjusting register 31 (here, the output signal is controlled by the ¼ cycle unit of the reference clock) is set in the frequency adjusting register 31. In the output stage delay circuit 20 receiving the value set in the frequency adjusting register 31 as the second selection signal S2, the signal output from the selector 24 is fixed to the output Sh of the ¼ delay element. Further, the state of outputting the reference clock is selected in the selector 14 at first (see step S101 in FIG. 7).

When the reference clock is input (step S102 in FIG. 7), the selector 14 selects the reference clock Sa to be input based on the value set in the frequency adjusting register 31. Hence, the input stage delay circuit 10 outputs the H level signal at time t00. At this time, the output signal So output from the inverting F/F 40 is also raised to output the H level signal.

After that, at time t11, the counter 34 counts the rising of the fourth clock of the reference clock which is input. At this time, the number of clocks of the counter 34 and the duty set value match with each other. Accordingly, the signal Sn output from the comparator (not shown) between the duty compare register 36 and the counter 34 is raised (see Sn in FIG. 6). When the signal Sn is raised, the inverting F/F 40 inverts the output signal. Hence, the output signal So is fallen.

At time t22, the reference clock is raised. Since the selector 14 selects the reference clock Sa, the signals Se and Sf are raised in accordance with the rising of the Sa. Accordingly, the counter 34 counts the rising of the eighth clock of the reference clock which is input. At this time, the number of clocks of the counter 34 and the cycle set value match with each other (step S103 in FIG. 7). Hence, the signal Sm output from the comparator (not shown) between the cycle compare register 35 and the counter 34 is raised (see Sm in FIG. 6). At this time, since the signal Sh (see Sh, Sk in FIG. 6) delaying the signal Sm by ¼ cycle is selected as the output signal Sk of the output stage delay circuit 20, the output signal Sk keeps the L level. Hence, the signal So output from the inverting F/F 40 also keeps the L level. When the number of clocks of the counter 34 and the cycle set value do not match with each other in step S103 in FIG. 7, the process goes back to step S102 again.

Since the signal Sm transits, the input stage delay setting part 32 outputs to the selector 14 the signal switching the signal to be selected to Sb. More specifically, the output Sb from the ¼ delay element is selected based on the first selection signal S1 from the input stage delay setting part 32 at time t33. Hence, the input stage delay output signal Se is fallen to be the L level (see Se in FIG. 6). At this time, since the gate circuit 33b has an output fixed so as not to count up the counter 34, the output Sf of the gate circuit 33b does not change but keeps the H level (see Sf in FIG. 6, see step S104 in FIG. 7). In summary, the level of the output of the input stage delay circuit 10 is held. At this time, the output signal Sk keeps the L level, and the signal So also keeps the L level.

After that, at time t44, the input stage delay output signal Se is raised in accordance with the rising of the output signal of the ¼ delay element 11 (step S105 in FIG. 7). At this time, the output signal Sk of the output stage delay circuit 20 delaying the signal Sm by ¼ cycle is raised. Hence, the signal Sk input to the inverting F/F 40 transits; therefore, the inverting F/F 40 transits the output signal So. At this time, the levels of the output Se of the input stage delay circuit 10, the output Sm of the control section 30, and the output signal Sk match with each other, and the holding of the output of the input stage delay circuit 10 is canceled. Accordingly, the second cycle of the output signal So is started, and the gate circuit 33b again becomes a state of outputting the signal which is input (see Sf in t44 in FIG. 6). Then the output signal So is in the H level and the output Se of the input stage delay circuit 10 is fallen. Further, the output Sf of the gate circuit 33b is in the L level, and the clock is supplied to the counter 34 (step S106 in FIG. 7). Then the process goes back to step S102 again and repeats the above-described operation; so that the signal whose duty ratio is controlled by the ¼ cycle unit is output.

From the above description, the input stage delay circuit 10 and the output stage delay circuit 20 each includes a plurality of delay elements having delay of cycle shorter than that of the reference clock in the signal generating circuit 2 according to the second exemplary embodiment. Then, the delay elements selected at the input stage delay circuit 10 are sequentially switched when the delay elements of the output stage delay circuit 20 is fixed to the ¼ cycle delay, and the signal Sm output from the comparator between the counter 34 and the cycle compare register 35 transits. At this time, the output of the input stage delay circuit 10 is held for a delay period of time selected at the output stage delay circuit 20. Hence, it is possible to output from the signal generating circuit 2 the signal whose duty ratio of the output signal is controlled by a cycle finer than that of the reference clock. Further, by changing the delay element selected in the output stage delay circuit 20 to the ⅔ delay element or the ¾ delay element, the duty ratio of the output signal can be controlled by the ⅔ cycle unit or the ¾ cycle unit. The operation of the signal generating circuit 2 when the delay element selected at the output stage delay circuit 20 is changed to the ⅔ delay element 22 or to the ¾ delay element 23 will be described later in detail.

Further, when the duty ratio of the output signal is controlled by a unit shorter than the cycle of the reference clock, there is provided a period of extending the clock of the counter for a certain period of time. More specifically, when the output signal So is switched from the first cycle to the second cycle, the output signal Sf of the gate circuit 33b keeps the level of the output Se of the input stage delay circuit 10 so as to prevent the counter 34 from counting up the number of clocks until when the output signal Se from the input stage delay circuit 10 switches from Sa to Sb and the output signal So is raised next time. Accordingly, when the duty ratio of the output signal So is controlled by a cycle shorter than that of the reference clock, the count period of the counter 34 corresponding to the period of control is extended. Hence, it is possible to output the output signal So without waiting for the counter 34 counting one clock. Hence, the operation speed of the signal generating circuit 2 can be improved.

Figure 8:
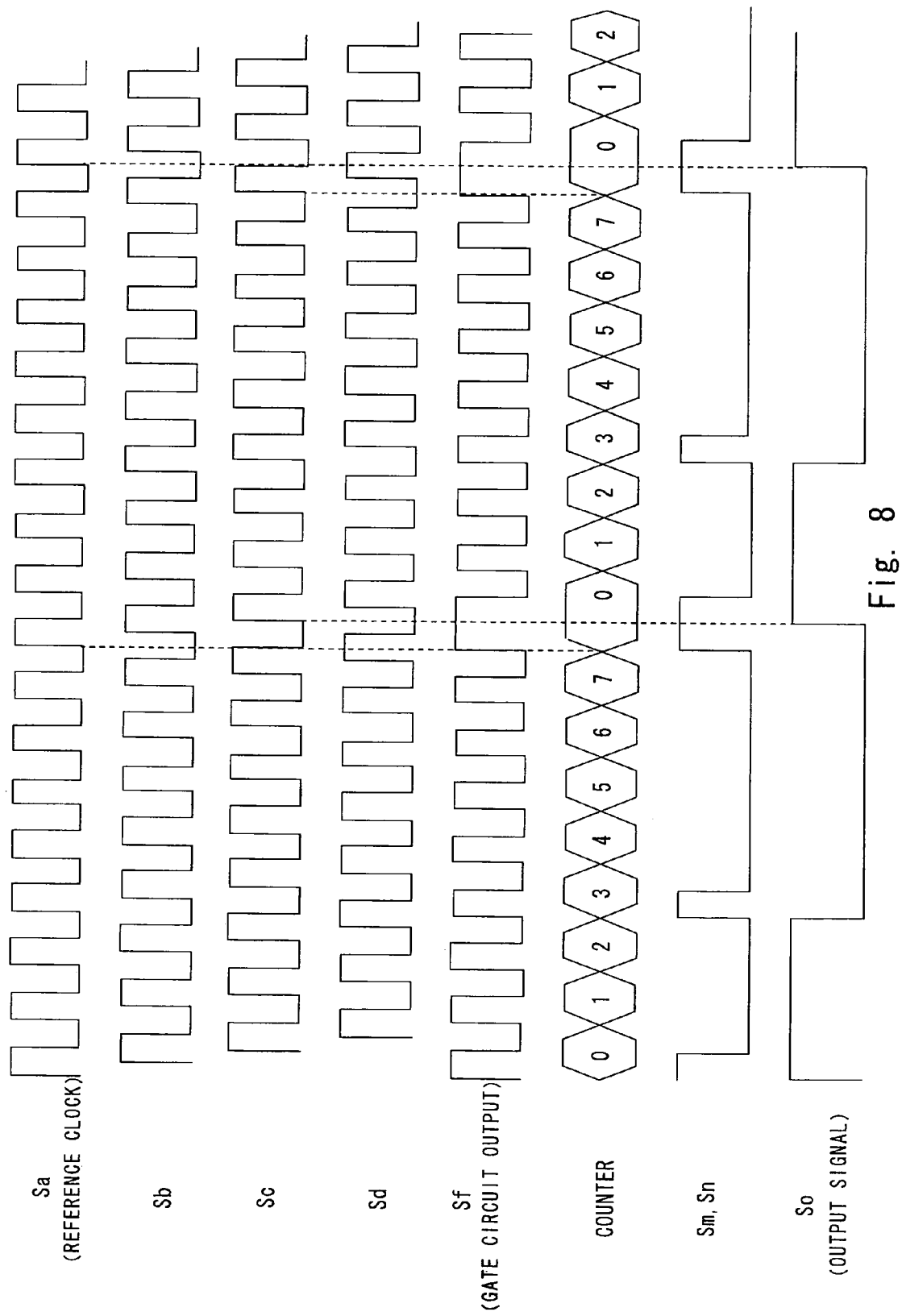
FIG. 8 is a timing chart showing an operation when the duty ratio of the output clock is controlled by 2/4 cycle unit.
Figure 9:
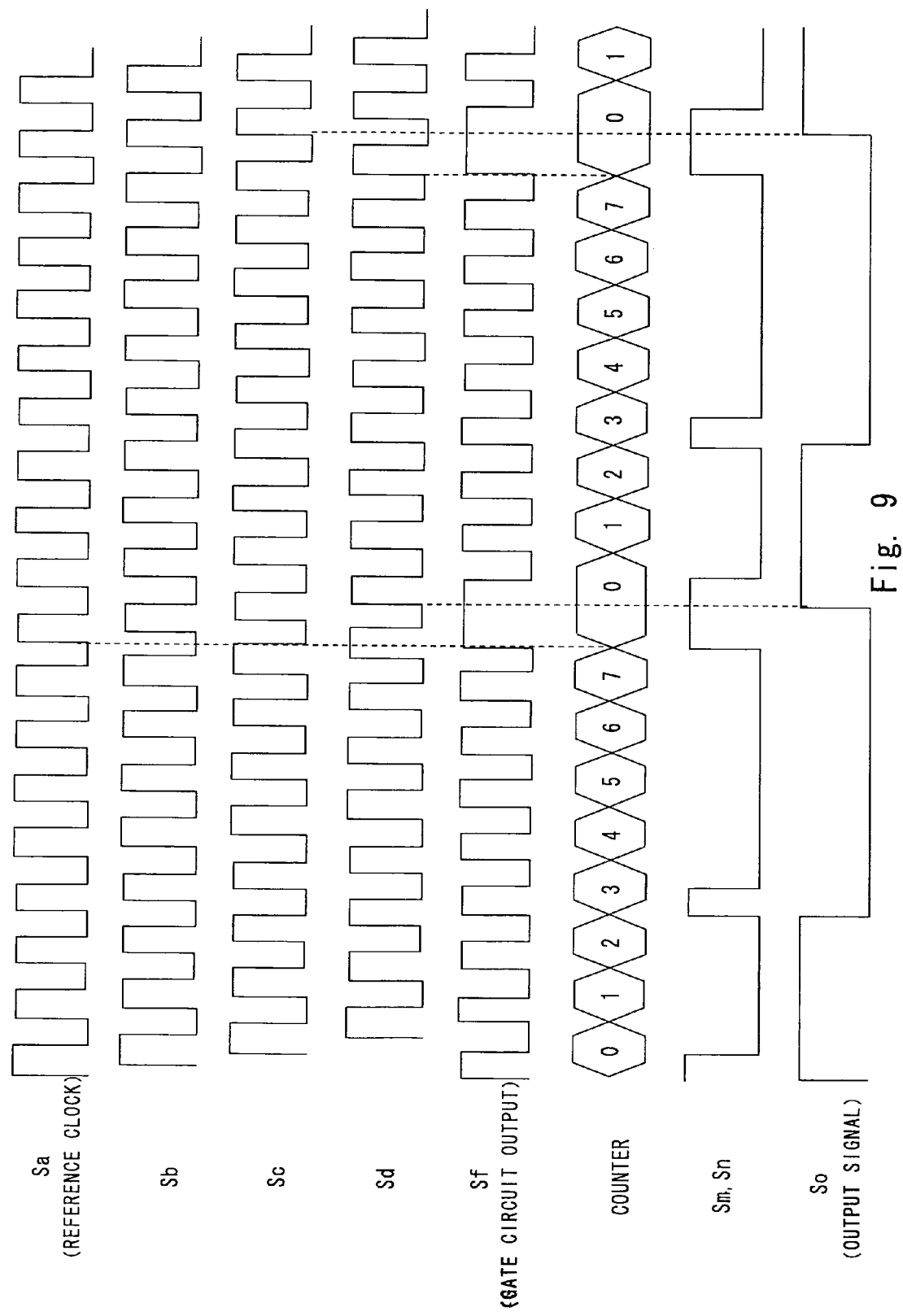
FIG. 9 is a timing chart showing an operation when the duty ratio of the output clock is controlled by ¾ cycle unit.

Now, FIG. 8 shows a timing chart showing the operation of a case of controlling the duty ratio of the output clock by the ⅔ cycle unit. FIG. 9 shows a timing chart showing the operation of a case of controlling the duty ratio of the output clock by the ¾ cycle unit. In FIGS. 8 and 9, the signals Sm and Sn shown in FIG. 6 are shown in one waveform.

The description will be made first on a case of controlling the duty ratio by the ⅔ cycle unit. As shown in FIG. 8, when the duty ratio of the output clock is controlled by the ⅔ cycle, for example, the delay element of the output stage delay circuit 20 is fixed to the ⅔ cycle delay. The reference clock is output first as the output of the input stage delay circuit 10. Then, the counter 34 counts the rising of the fourth clock of the reference clock to raise the signal Sn, for example. Hence, the output signal So is fallen. Next, the counter 34 counts the rising of the eighth clock of the reference clock which is input. Accordingly, the output Sm of the control section 30 is raised, and the selector 14 of the input stage delay circuit 10 switches the signal to be selected to Sc. At this time, the output Sf of the gate circuit 33b keeps the level of the output Se (not shown) of the input stage delay circuit 10. Then, the output signal Se of the input stage delay circuit 10 is raised in accordance with the rising of the output signal Sc of the ⅔ delay element 12. Then the output signal Sk of the output stage delay circuit 20 delaying the signal Sm by ⅔ cycle is raised. Accordingly, the signal Sk input to the inverting F/F 40 transits, and the holding of the output Se of the input stage delay circuit 10 is canceled. Then the inverting F/F 40 transits the output signal So, so that the second cycle is started.

As stated above, when the counter 34 counts the number of clocks stored in the cycle compare register 35, the output signal So is fallen; when the counter 34 counts the number of clocks stored in the duty compare register 36, the clock of the counter 34 is extended by a period of the selected delay element. When the duty ratio shown in FIG. 9 is controlled by the ¾ cycle unit, the count of the counter 34 is extended by the ¾ cycle. Hence, it is possible to control the duty ratio of the output signal So by a clock shorter than that of the reference clock.

From the above description, in the signal generating circuit 2 according to the second exemplary embodiment, the delay element of the output stage delay circuit 20 is fixed to the ¼ cycle delay, for example. When the signal Sm output from the comparator which is between the counter 34 and the cycle compare register 35 transits, the delay elements selected at the input stage delay circuit 10 are sequentially switched. At this time, the output Se of the input stage delay circuit 10 is held for a delay period of time selected at the output stage delay circuit 20. Hence, it is possible to output from the signal generating circuit 2 the signal whose duty ratio of the output signal is controlled by a cycle finer than that of the reference clock.

Note that the present invention is not limited to the exemplary embodiments described above, but can be changed as appropriate without departing from the spirit of the present invention. For example, in the exemplary embodiments of the present invention, the input stage delay circuit 10 and the output stage delay circuit 20 each includes three delay elements, but the number of delay elements can be increased or decreased in accordance with the control of the output signal.

The first and second third exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A signal generating circuit, comprising:
    an input stage delay circuit which can switch a state of outputting a reference clock and a state of outputting a signal delaying the reference clock by a first time which is shorter than one cycle of the reference clock;
    a control section including a gate circuit holding the output of the input stage delay circuit for a second time which is shorter than one cycle of the reference clock from a point at which the output of the input stage delay circuit is changed to output a signal corresponding to the output of the gate circuit; and
    an output stage delay circuit outputting a signal delaying the output signal of the control section by the second time, wherein the input stage delay circuit switches an output state in response to change of the output signal of the control section.

2. The signal generating circuit according to claim 1, wherein
the input stage delay circuit includes delay elements which can provide delay of the first time, and
the output stage delay circuit includes delay elements which can provide delay of the second time.

3. The signal generating circuit according to claim 2, wherein the input stage delay circuit and the output stage delay circuit each includes (n−1) delay elements, each of which can provide delays of 1/n, 2/n, . . . , (n−2)/n, (n−1)/n times when the second time corresponds to m/n (m, n are natural numbers, m<n, irreducible fraction) time with respect to one cycle of the reference clock.

4. The signal generating circuit according to claim 3, wherein the output stage delay circuit selects a delay element which can provide the delay of the m/n time from among the (n−1) delay elements.

5. The signal generating circuit according to claim 4, wherein the input stage delay circuit selects a state of outputting the reference clock at first and then selects a delay element capable of providing a delay time equal to the delay element selected at the output stage delay circuit when the output state is switched in response to the change of the output signal of the control section for the first time.

6. The signal generating circuit according to claim 1, wherein the gate circuit directly outputs the output of the input stage delay circuit without holding the output of the input stage delay circuit when the output of the input stage delay circuit, the output of the control section, and the output of the output stage delay circuit all match with each other.

7. The signal generating circuit according to claim 2, wherein the gate circuit directly outputs the output of the input stage delay circuit without holding the output of the input stage delay circuit when the output of the input stage delay circuit, the output of the control section, and the output of the output stage delay circuit all match with each other.

8. The signal generating circuit according to claim 3, wherein the gate circuit directly outputs the output of the input stage delay circuit without holding the output of the input stage delay circuit when the output of the input stage delay circuit, the output of the control section, and the output of the output stage delay circuit all match with each other.

9. The signal generating circuit according to claim 4, wherein the gate circuit directly outputs the output of the input stage delay circuit without holding the output of the input stage delay circuit when the output of the input stage delay circuit, the output of the control section, and the output of the output stage delay circuit all match with each other.

10. The signal generating circuit according to claim 5, wherein the gate circuit directly outputs the output of the input stage delay circuit without holding the output of the input stage delay circuit when the output of the input stage delay circuit, the output of the control section, and the output of the output stage delay circuit all match with each other.

11. The signal generating circuit according to claim 1, wherein
the control section comprises:
a counter counting a number of pulses output from the gate circuit; and
a cycle compare register storing a cycle set value compared with a count value of the counter, and
the control section outputs the comparison result of the count value and the cycle set value as a signal corresponding to the output of the gate circuit.

12. The signal generating circuit according to claim 2, wherein
the control section comprises:
a counter counting a number of pulses output from the gate circuit; and
a cycle compare register storing a cycle set value compared with a count value of the counter, and
the control section outputs the comparison result of the count value and the cycle set value as a signal corresponding to the output of the gate circuit.

13. The signal generating circuit according to claim 3, wherein
the control section comprises:
a counter counting a number of pulses output from the gate circuit; and
a cycle compare register storing a cycle set value compared with a count value of the counter, and
the control section outputs the comparison result of the count value and the cycle set value as a signal corresponding to the output of the gate circuit.

14. The signal generating circuit according to claim 4, wherein
the control section comprises:
a counter counting a number of pulses output from the gate circuit; and
a cycle compare register storing a cycle set value compared with a count value of the counter, and
the control section outputs the comparison result of the count value and the cycle set value as a signal corresponding to the output of the gate circuit.

15. The signal generating circuit according to claim 5, wherein
the control section comprises:
a counter counting a number of pulses output from the gate circuit; and
a cycle compare register storing a cycle set value compared with a count value of the counter, and
the control section outputs the comparison result of the count value and the cycle set value as a signal corresponding to the output of the gate circuit.

16. The signal generating circuit according to claim 11, wherein
the control section comprises a duty compare register storing a duty set value compared with the count value of the counter,
the signal generating circuit comprises an inverting flip-flop to which the comparison result of the count value and the duty set value, and the output of the output stage delay circuit are input, and
the inverting flip-flop changes a logic level of an output signal in response to change of the comparison result of the count value and the duty set value and change of the output of the output stage delay circuit.

17. The signal generating circuit according to claim 12, wherein
the control section comprises a duty compare register storing a duty set value compared with the count value of the counter,
the signal generating circuit comprises an inverting flip-flop to which the comparison result of the count value and the duty set value, and the output of the output stage delay circuit are input, and
the inverting flip-flop changes a logic level of an output signal in response to change of the comparison result of the count value and the duty set value and change of the output of the output stage delay circuit.

18. The signal generating circuit according to claim 13, wherein the control section comprises a duty compare register storing a duty set value compared with the count value of the counter, the signal generating circuit comprises an inverting flip-flop to which the comparison result of the count value and the duty set value, and the output of the output stage delay circuit are input, and the inverting flip-flop changes a logic level of an output signal in response to change of the comparison result of the count value and the duty set value and change of the output of the output stage delay circuit.

19. The signal generating circuit according to claim 14, wherein the control section comprises a duty compare register storing a duty set value compared with the count value of the counter, the signal generating circuit comprises an inverting flip-flop to which the comparison result of the count value and the duty set value, and the output of the output stage delay circuit are input, and the inverting flip-flop changes a logic level of an output signal in response to change of the comparison result of the count value and the duty set value and change of the output of the output stage delay circuit.

20. The signal generating circuit according to claim 15, wherein the control section comprises a duty compare register storing a duty set value compared with the count value of the counter, the signal generating circuit comprises an inverting flip-flop to which the comparison result of the count value and the duty set value, and the output of the output stage delay circuit are input, and the inverting flip-flop changes a logic level of an output signal in response to change of the comparison result of the count value and the duty set value and change of the output of the output stage delay circuit.

\* \* \* \* \*